Feb. 20, 1962 T. C. McKNIGHT 3,022,431

CRYSTAL MOUNTS

Filed April 25, 1958

Inventor
Terence C. McKnight
By Holcombe, Wetherill & Brisebois
Attorneys

United States Patent Office 3,022,431
Patented Feb. 20, 1962

3,022,431
CRYSTAL MOUNTS

Terence Clifford McKnight, Cambridge, England, assignor to Pye Limited, Cambridge, England, a British company Filed Apr. 25, 1958, Ser. No. 730,849
Claims priority, application Great Britain May 3, 1957
1 Claim. (Cl. 310—9.4)

Figures 1, 2, 3:
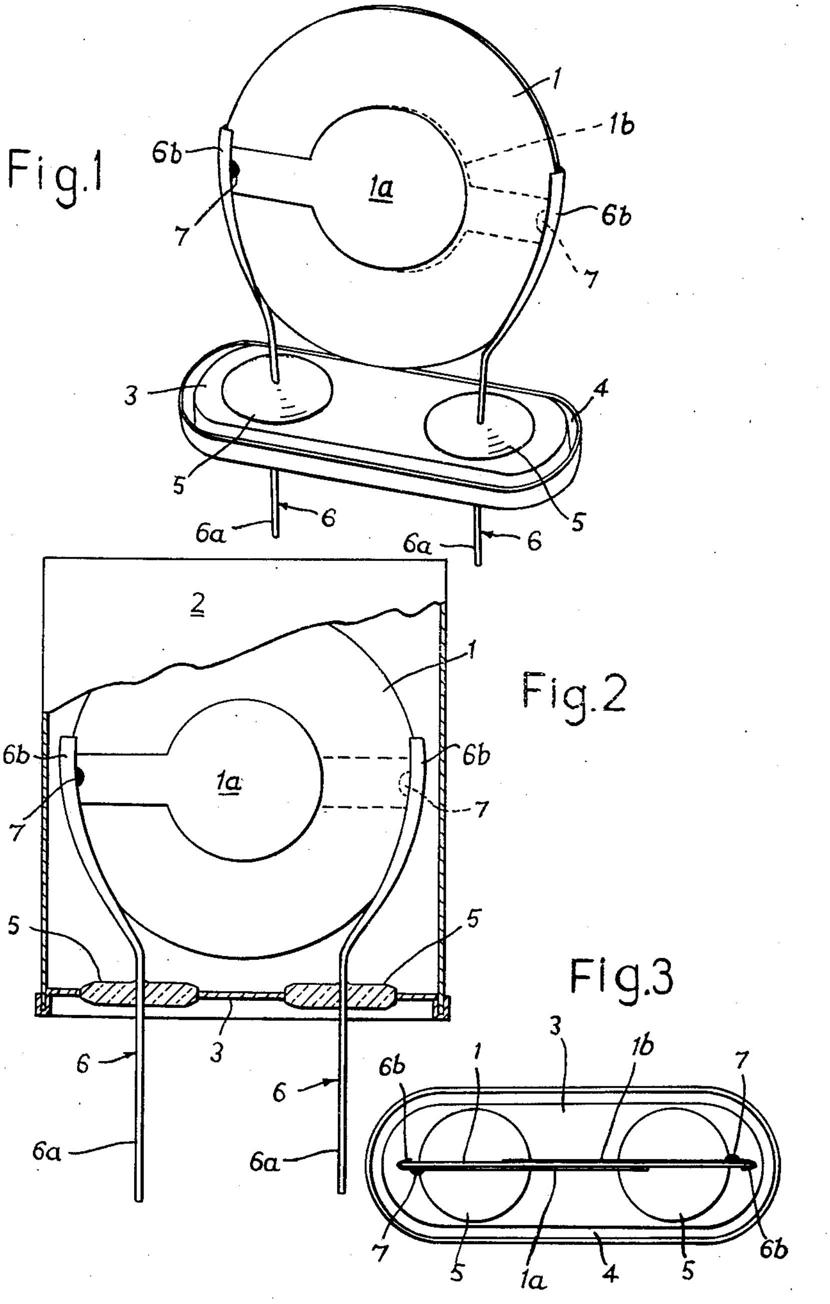

The present invention relates to piezo-electric crystal oscillator or resonator elements and to mounting arrangements for supporting such crystal elements and making electrical connections thereto. The invention may be particularly applied to crystals which oscillate in a thickness mode, such as AT or BT cut crystals, and which have adherent electrode coatings on their major surfaces.

Hitherto, crystal elements contained in metal, or synthetic resin containers or glass envelopes, usually hermetically sealed, have generally been supported by intermediate flexible electrical conductors, in the form of spring steel or phosphor-bronze or other conducting wire or strip, which are positioned between the crystal element and the externally-extending connecting pins or leads. These intermediate conductors are formed at one end to grip and retain the crystal, often with the addition of a thermo-setting conducting paste to add to the stability of the electrical contacts between the crystal electrodes and the supporting conductors. Such flexible electrical conductors are usually soldered, spot welded or otherwise rigidly connected to the conducting leads or pins passing through the enclosing casing or envelope. However, such intermediate electrical connectors are not simple to mount and align in relation to the crystal element itself, which may possess a thickness of no more than a few thousandths of an inch, and have also proved unsatisfactory because they tend to twist the crystal plate and impart changes to the electrical characteristics of the crystal. Furthermore a general method for connecting these intermediate conductors to the externally-extending connecting leads or pins is by the use of flux and high melting point solder which in turn requires considerable attention to the removal of any organic gases which are sometimes trapped within the joints. These organic gases are frequently released upon the heat sealing of the hermetic container and result in lowering the electrical activity and resonant frequency of the crystal.

It is therefore an object of the present invention to provide improved and simplified means for mounting a crystal element.

According to the present invention, a crystal element is supported directly by a portion of the conducting connecting pins or leads which also serve to connect the crystal element to an external circuit.

From another aspect, the invention provides a piezo-electric crystal unit comprising a crystal element housed within a casing or envelope, in which the conducting connecting pins or leads to the crystal element are insulated from each other and extend through a wall of the casing or envelope from the inside to the outside thereof, and the crystal element is connected to and supported directly by a portion of the pins or leads within the envelope.

The invention further provides a member, for example of glass or ceramic, through which extend two or more mutually insulated conductors, a portion of at least two conductors on one side of the member being shaped to support directly a crystal element, and the portion of said conductors on the other side of said member being adapted to serve as connecting pins or leads for connecting said crystal element to an external circuit.

At least the portion of the pin or leads which serve to support the crystal element is made sufficiently resilient so that the crystal element can withstand mechanical shock and vibration.

According to a feature of the invention, a portion of the pins or leads is shaped to engage the periphery or edge of the crystal element which is generally in the form of a slab or thin disc. Thus, in one form of the invention the crystal is supported from a pair of connecting wires having a circular cross section over part of their length, but which are formed into a channel section over the portion where they are to support the crystal, so that the sides of the channel embrace around the peripheral edges of the crystal element. The crystal element may be secured within the channel portion by means of a thermo-setting conducting paste applied to the point of contact between the crystal element and the channel. It will be understood that electrode coatings are deposited on opposite surfaces of the crystal element and are respectively electrically connected each to one of the connecting leads, preferably via the supporting portion thereof.

Where the connecting pins or leads are substantially rigid over the portion extending externally of the crystal unit, the internal portions which serve to support the crystal element may be rendered more resilient, for example by flattening, coiling or otherwise treating these portions.

An embodiment of the invention will now be described with reference to the accompanying drawing, in which:

FIGURE 1 is a perspective view of a crystal unit constructed according to this invention with the cover removed, FIGURE 2 is a front elevational view of the crystal unit, with the cover in position, and having parts broken away, and FIGURE 3 is a plan view of the crystal unit with the cover removed.

Referring to the drawings, the crystal unit consists of a crystal element 1 which is mounted within a metal casing consisting of a cover 2, fitting on to a base portion 3. The cover can be permanently sealed to the base portion, for example by soldering around the lower edge of the cover located in the groove 4 formed in the base 3, in order to form a hermetically sealed crystal unit. The base 3 is provided with two insulating beads or bushes 5 which may be formed of glass or a ceramic material, through which extend two connecting wires 6, having a similar or a related coefficient of expansion to the insulating bushes, the external portions **6*a* of the wires 6 serving as leads for connecting the crystal element into an electrical circuit. According to the present invention, the inner end portion 6*b* of the connecting wires is formed into a channel section and these portions are shaped and arranged directly to support the crystal element 1 in position, with the sides of the channels extending around the peripheral edges of the crystal element. The portions 6*b* of the wires 6 may be formed to the channel section either before or after the wires are sealed to the insulators 5, and possess sufficient resilience to protect the crystal element against mechanical shock and vibration. The crystal element is held in position within the channels by means of a thermo-setting conducting paste 7 which also serves to make electrical connection between the electrode coatings 1*a* and 1*b*, deposited on opposite surfaces of the crystal, and the respective connecting wires 6. If desired the portions 6*b* of the wires may be made slightly shorter than shown in the drawing so that the conducting paste is positioned at the extreme tip of these supporting portions 6*b***.

It will be seen that the construction according to the present invention avoids the necessity of providing intermediate support members between the crystal element and the external connecting wires, which results in a considerable saving in the cost of manufacturing the crystal unit. The crystal element is also held in a resilient shock-resistant manner without risk of twisting or warping as occurs when intermediate spring supporting members are employed. The necessity of applying heat near the crystal element in order to solder or weld intermediate connecting members to the connecting pins is avoided, and a saving of space between the crystal element and the base of the unit can therefore also be effected since it is not necessary to leave a space to effect such soldered connections. Moreover, by providing supports adjacent the periphery of the crystal element, mechanical damping of the oscillating surfaces is reduced to a minimum.

The construction according to the present invention is thus inexpensive, easy to produce and extremely effective in preserving the natural frequency stability of the crystal element. This construction is particularly advantageous for supporting very thin crystal elements which are otherwise difficult to handle, and mount, i.e. crystal elements oscillating or resonant on fundamental or overtone thickness modes at frequencies above 2.5 mc./s and particularly above 5 mc./s.

It will be understood that various modifications may be made without departing from the scope of this invention. For example, the crystal element supporting portions of the connecting pins or leads may be fashioned to various other shapes besides the channel shape shown, to suit individual shapes and sizes of crystal element, for example rectangular elements. Furthermore, it will be understood that more than one crystal element may be housed in the same unit, each element being supported directly by a pair of conductors.

I claim:

A piezo-electric crystal unit comprising a support member, a pair of mutually insulated one-piece conductors extending through and carried by said support member, a crystal element, an upper end portion integral with each of said conductors blended from the cross-section of the conductor to form a channel having a U-shaped cross-section and extending at least partially beneath and supporting the underside of the crystal element, the sides of each channel embracing around the peripheral edges of the crystal element and the lowermost peripheral edge of the crystal element being closely spaced from the upper surface of the support member, a resilient portion of each conductor below said channel between said channel and said support member whereby the crystal element is capable of withstanding mechanical shock, and vibration, an electrode coating deposited on the two opposite surfaces of the crystal element, a conducting paste securing said crystal element to said channels and electrically connecting one of said electrode coatings to one of said channels and the other of said electrode coatings to the other of said channels, and a portion of each of said conductors on the opposite side of said supporting member being adapted to be directly connected to an external circuit.

References Cited in the file of this patent

UNITED STATES PATENTS

| | | |
|---|---|---|
| 2,503,429 | Ziegler | Apr. 11, 1950 |
| 2,635,199 | Wolfskill | Apr. 14, 1953 |
| 2,648,785 | Tournier | Aug. 11, 1953 |
| 2,676,275 | Bigler | Apr. 20, 1954 |
| 2,784,326 | Purdue | Mar. 5, 1957 |
| 2,824,981 | Warden | Feb. 25, 1958 |
| 2,856,549 | Hunt | Oct. 14, 1958 |
| 2,857,532 | Ziegler | Oct. 21, 1958 |